United States Patent
Yu et al.

(10) Patent No.: US 10,658,263 B2
(45) Date of Patent: May 19, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chi-Yang Yu, Taoyuan (TW); Chin-Liang Chen, Kaohsiung (TW); Kuan-Lin Ho, Hsinchu (TW); Yu-Min Liang, Taoyuan (TW); Wen-Lin Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/993,615

(22) Filed: May 31, 2018

(65) Prior Publication Data

US 2019/0371699 A1 Dec. 5, 2019

(51) Int. Cl.

| | | |
|---|---|---|
| *H01L 23/34* | (2006.01) | |
| *H01L 23/373* | (2006.01) | |
| *H01L 23/00* | (2006.01) | |
| *H01L 23/31* | (2006.01) | |
| *H01L 23/495* | (2006.01) | |

(52) U.S. Cl.
CPC ........ *H01L 23/373* (2013.01); *H01L 23/3121* (2013.01); *H01L 24/96* (2013.01); *H01L 23/49568* (2013.01)

(58) Field of Classification Search
CPC ... H01L 23/373; H01L 23/3121; H01L 24/96; H01L 23/49568
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Stephen M Bradley
*Assistant Examiner* — Wasiul Haider
(74) *Attorney, Agent, or Firm* — JCIPRNET

(57) ABSTRACT

A semiconductor package and a manufacturing method thereof are provided. The semiconductor package includes a first semiconductor die, a second semiconductor die, a molding compound, a heat dissipation module and an adhesive material. The first and second semiconductor dies are different types of dies and are disposed side by side. The molding compound encloses the first and second semiconductor dies. The heat dissipation module is located directly on and in contact with the back sides of the first and second semiconductor dies. The adhesive material is filled and contacted between the heat dissipation module and the molding compound. The semiconductor package has a central region and a peripheral region surrounding the central region. The first and second semiconductor dies are located within the central region. A sidewall of the heat dissipation module, a sidewall of the adhesive material and a sidewall of the molding compound are substantially coplanar.

20 Claims, 11 Drawing Sheets

(56) References Cited

U.S. PATENT DOCUMENTS

| | | |
|---|---|---|
| 9,368,460 B2 | 6/2016 | Yu et al. |
| 9,372,206 B2 | 6/2016 | Wu et al. |
| 9,496,189 B2 | 11/2016 | Yu et al. |
| 2013/0208426 A1* | 8/2013 | Kim .................... H01L 25/0657 361/717 |
| 2014/0284040 A1* | 9/2014 | Colgan ................. H01L 23/36 165/185 |
| 2015/0221625 A1* | 8/2015 | Chun ..................... H01L 24/17 257/707 |
| 2015/0357309 A1* | 12/2015 | Liu ......................... H01L 25/50 257/692 |
| 2017/0062383 A1* | 3/2017 | Yee .................... H01L 25/0652 |

* cited by examiner

SEMICONDUCTOR PACKAGE AND MANUFACTURING METHOD THEREOF

BACKGROUND

As electronic products are continuously miniaturized, heat dissipation of the packaged semiconductor die(s) has become an important issue for packaging technology. In addition, for multi-die packages, the arrangement of the dies and the corresponding connecting elements has impacts on data transmission speed among semiconductor dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
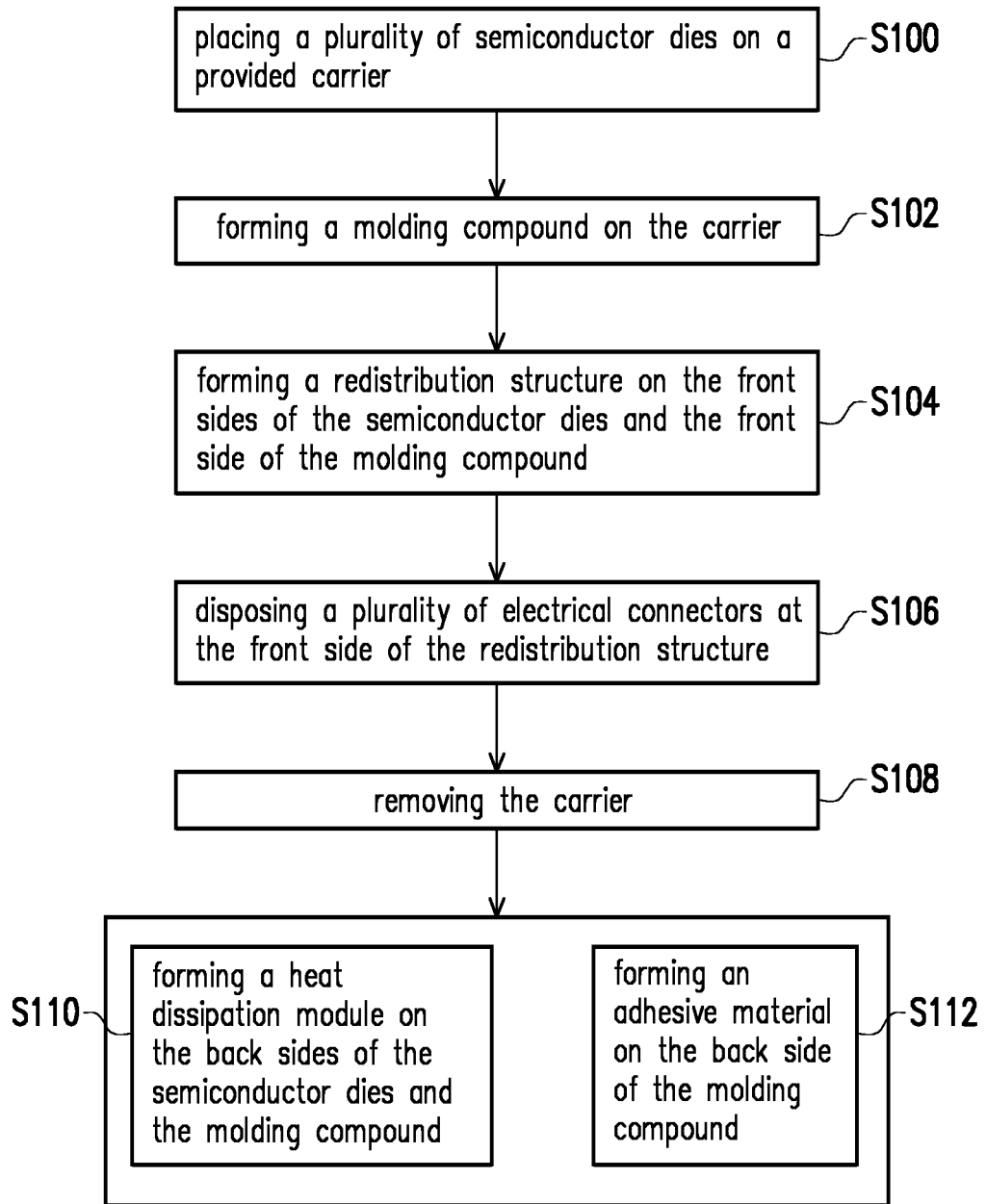
FIG. 1 is an exemplary flow chart showing the process steps of a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is an exemplary flow chart showing the process steps of a manufacturing method of a semiconductor package 100A according to some embodiments of the present disclosure. FIG. 2A through FIG. 2H are schematic cross-sectional views illustrating intermediate structures at various stages according to the manufacturing method of the semiconductor package 100A shown in FIG. 1.

Figure 2A:
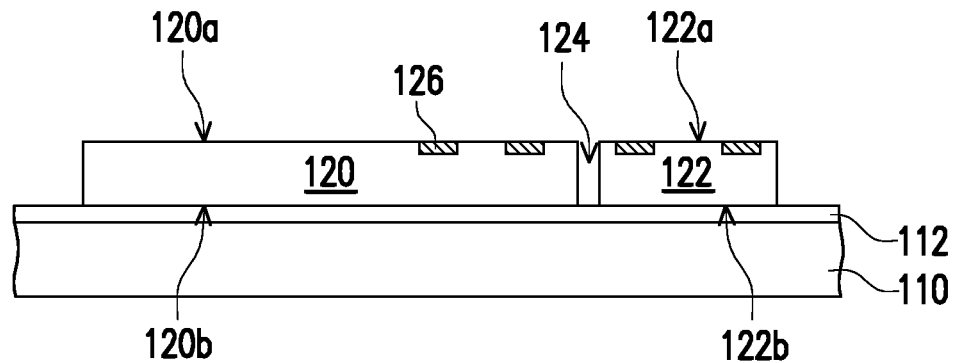
FIG. 2A through FIG. 2H are schematic cross-sectional views illustrating intermediate structures at various stages according to the manufacturing method of semiconductor package shown in FIG. 1.

Referring to FIG. 1 and FIG. 2A, step S100 is performed, and a plurality of semiconductor dies are placed on a provided carrier 110. In some embodiments, the carrier 110 is a glass substrate. An adhesive layer 112 may be formed on the carrier 110 before the semiconductor dies are placed on the carrier 110. In some embodiments, the adhesive layer 112 may be a single layer, such as a light-to-heat conversion (LTHC) release layer or a thermal release layer. In other embodiments, the adhesive layer 112 may include multiple layers, including a release layer and a die attach film (not shown) sequentially formed on the carrier 100.

In some embodiments, the semiconductor dies may respectively include a logic die, such as a central processing unit (CPU) die, a graphic processing unit (GPU) die, a mobile application die, a micro control unit (MCU) die, an input-output (I/O) die, a baseband (BB) die, an application processor (AP) die or a memory die such as high bandwidth memory die. For instance, the semiconductor dies may include a first semiconductor die 120 and a second semiconductor die 122. In some embodiments, the first semiconductor die 120 and the second semiconductor die 122 are different types of dies. In some embodiments, the first semiconductor die 120 is a logic die, while the second semiconductor die 122 is a memory die. The first semiconductor die 120 and the second semiconductor die 122 are disposed side by side on the carrier 110. The first semiconductor die 120 may be spaced apart from the second semiconductor die 122 by a spacing 124. Those skilled in the art may adjust the number and spacing of the semiconductor dies according to design requirements, the present disclosure is not limited thereto. The first semiconductor die 120 is attached to the carrier 110 by a back side 120b, and a front side 120a of the first semiconductor die 120 is exposed. Similarly, the second semiconductor die 122 is attached to the carrier 110 by a back side 122b, and a front side 122a of the second semiconductor die 122 is exposed. In some embodiments, the front side 120a of the first semiconductor die 120 and the front side 122a of the second semiconductor die 122 respectively expose a plurality of conductive pads 126, which are respectively coupled to the active devices (not shown) formed in the first semiconductor die 120 and the second semiconductor die 122. In alternative embodiments, rather than the conductive pads 126, a plurality of conductive pillars (not shown) may be disposed at the front side 120a of the first semiconductor die 120 and at the front side 122a of the second semiconductor die 122.

Figure 2B:
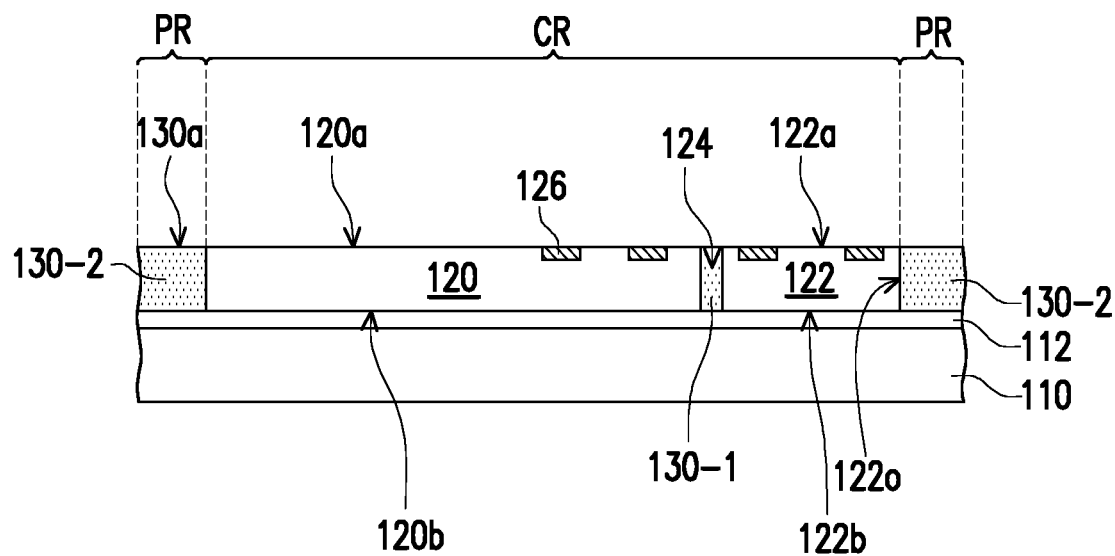

Referring to FIG. 1 and FIG. 2B, step S102 is performed, and a molding compound 130 is formed on the carrier 110. In some embodiments, the formation of the molding compound 130 may include forming a molding compound material on the carrier 110 and over the first semiconductor die 120 and the second semiconductor die 122. Afterward, a planarization operation, such as a chemical mechanical polish (CMP) process or a grinding process, may be performed on the molding compound material to expose the conductive pads 126 at the front side 120a of the first semiconductor die 120 and the front side 122a of the second semiconductor die 122, so as to form the molding compound 130. As such, a front side 130a of the molding compound 130 may be coplanar with the front side 120a of the first semiconductor die 120 and the front side 122a of the second semiconductor die 122. In addition, the spacing 124 between the first semiconductor die 120 and the second semiconductor die 122 are filled by a central portion 130-1 of the molding compound 130. A peripheral portion 130-2 of the molding compound 130 surrounds the first semiconductor die 120 and the second semiconductor die 122. In other words, sidewalls of the first and second semiconductor dies 120 and 122 are enclosed by the central and peripheral portions 130-1 and 130-2 of the molding compound 130. In some embodiments, a material of molding compound 130 may include epoxy resin, polyimide, silica, a combination thereof or the like. The molding compound 130 and the first and second semiconductor dies 120 and 122 can be referred as a package structure or a reconstructed wafer, and has a central region CR and a peripheral region PR. The central region CR is surrounded by the peripheral region PR. The first and second semiconductor dies 120 and 122 and the central portion 130-1 of the molding compound 130 are located within the central region CR. The peripheral portion 130-2 of the molding compound 130 is located within the peripheral region PR.

Figure 2C:
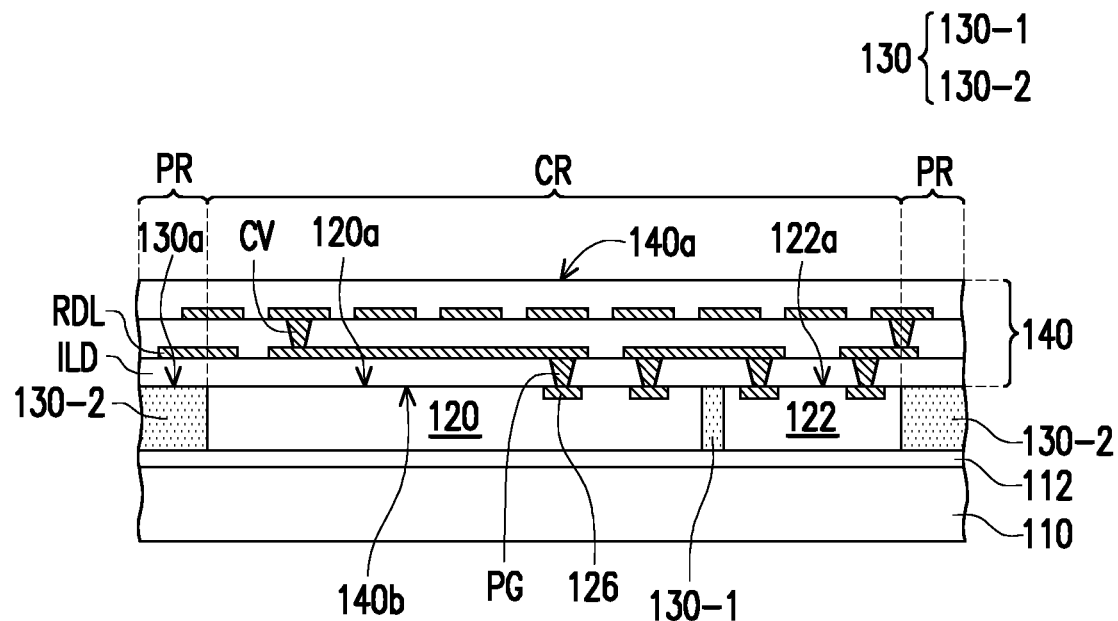

Referring to FIG. 1 and FIG. 2C, step S104 is performed, and a redistribution structure 140 is formed on the front side 120a of the first semiconductor die 120, the front side 122a of the second semiconductor die 122 and the front side 130a of the molding compound 130. The redistribution structure 140 contacts the front side 120a of the first semiconductor die 120, the front side 122a of the second semiconductor die 122 and the front side 130a of the molding compound 130 by a back side 140b. Accordingly, a front side 140a of the redistribution structure 140 is exposed. The redistribution structure 140 is electrically coupled to the conductive pads 126 formed at the front side 120a of the first semiconductor die 120 and the front side 122a of the second semiconductor die 122. In some embodiments, the redistribution structure 140 includes a plurality of dielectric layers ILD and a plurality of redistribution layers RDL. The dielectric layer ILD and the redistribution layer RDL are alternately stacked on the front side 120a of the first semiconductor die 120, the front side 122a of the second semiconductor die 122 and the front side 130a of the molding compound 130. A plurality of conductive vias CV are electrically connected between adjacent redistribution layers RDL, and a plurality of conductive plugs PG are electrically connected between the bottommost redistribution layer RDL and the conductive pads 126 formed at the front side 120a of the first semiconductor die 120 and the front side 122a of the second semiconductor die 122. A material of the dielectric layer ILD may include silicon oxide, silicon nitride, polybenzoxazole (PBO), polyimide (PI), benzocyclobutene (BCB), a combination thereof or the like. A material of the redistribution layer RDL may include copper, nickel, titanium, a combination thereof or the like. In some embodiments, materials of the redistribution layers RDL, the conductive vias CV and the conductive plugs PG may be identical. Since the redistribution structure 140 extends from the central region CR into the peripheral region PR, an available area of package is expanded, and a fan-out structure is constructed.

Figure 2D:
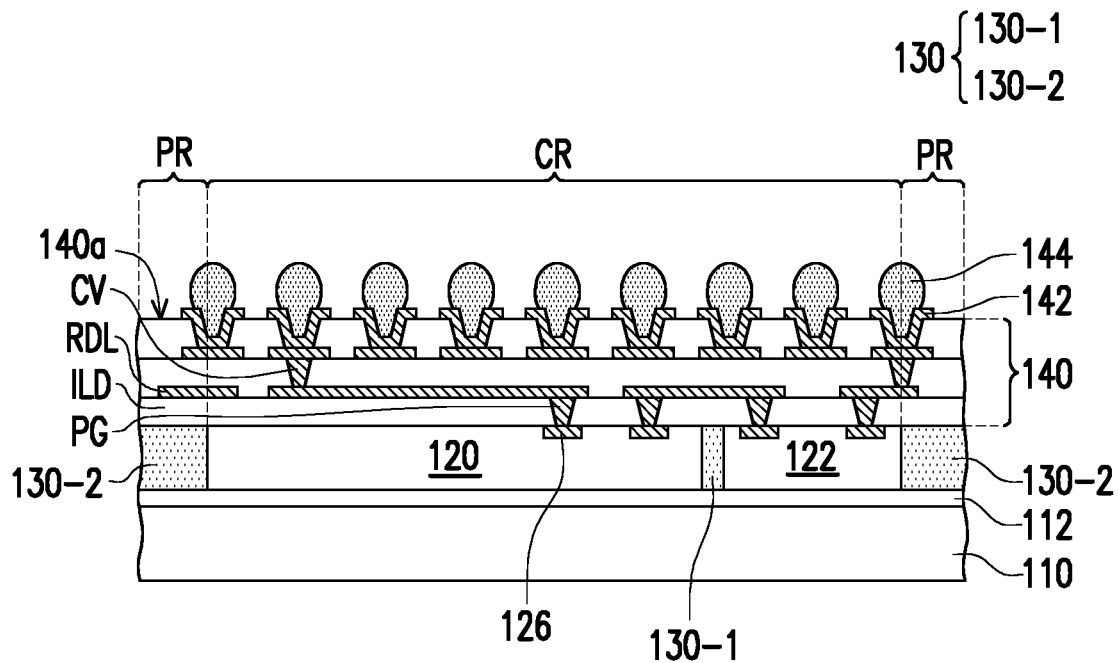

Referring to FIG. 1 and FIG. 2D, in some embodiments, step S106 is performed, and a plurality of electrical connectors 144 are disposed at the front side 140a of the redistribution structure 140. Before forming the electrical connector 144, under bump metallurgies (UBMs) 142 are formed on the front side 140a of the redistribution structure 140. In some embodiments, a material of the UBMs 142 may include nickel, copper, titanium, a combination thereof or the like. In some embodiments, the UBMs 142 extends into the topmost dielectric layer ILD of the redistribution structure 140, and electrically connects with the topmost redistribution layer RDL of the redistribution structure 140. As such, the UBMs 142 are electrically connected between the redistribution structure 140 and the electrical connectors 144. In some embodiments, the electrical connectors 144 are solder balls and/or bumps, such as controlled collapse chip connection (C4), electroless nickel immersion Gold (ENIG), electroless nickel electroless palladium immersion gold technique (ENEPIG) formed bumps or the like. In these embodiments, the bumps may include a conductive material such as solder, copper, or gold. The electrical connectors may be formed by suitable methods such as evaporation, electroplating, printing, solder transfer, ball placement or the like. In addition, a reflow may be performed in order to shape the material into the desired bump shapes.

Figure 2E:
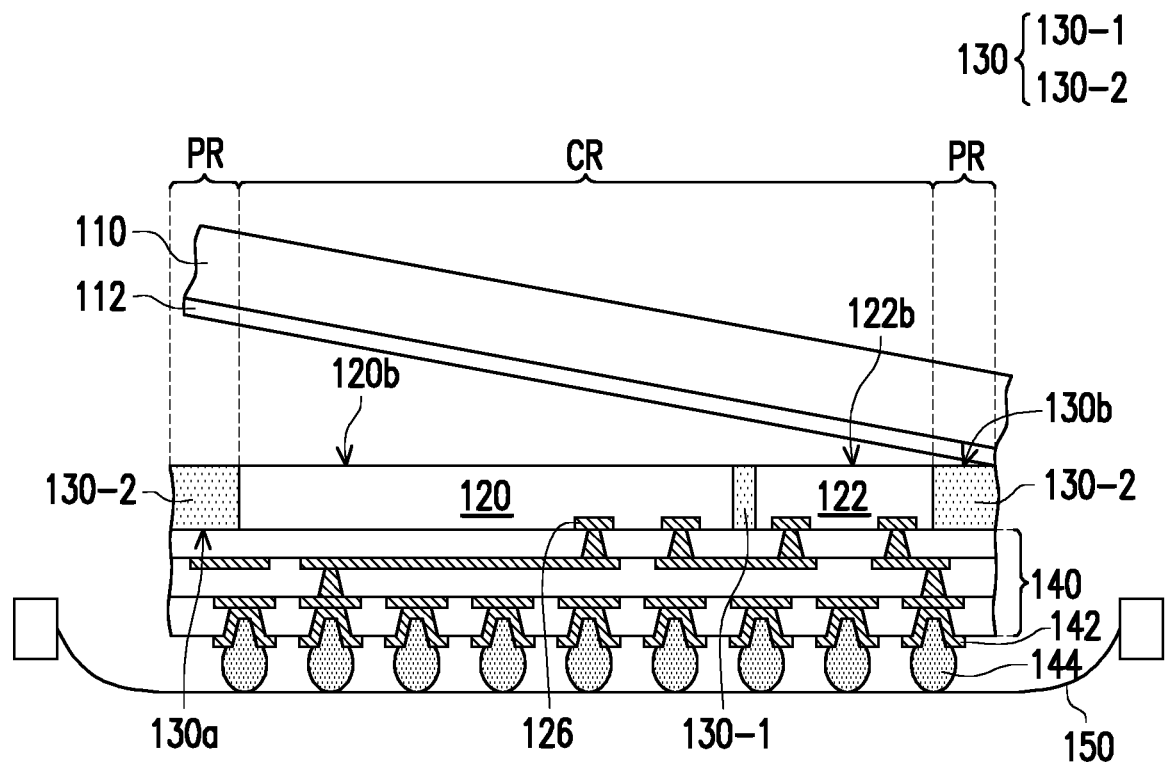

Referring to FIG. 1 and FIG. 2E, step S108 is performed, and the carrier 110 is removed. In some embodiments, the adhesive layer 112 includes a LTHC layer or a thermal release layer, and the carrier 110 is detached from the back side 120b of the first semiconductor die 120, the back side 122b of the second semiconductor die 122 and the back side of the molding compound 130 as the adhesive layer 112 loses its adhesive property when exposed to light or heat. That is, the carrier 110 and the adhesive layer 112 are detached and separated from the first semiconductor die 120, the second semiconductor die 122 and the molding compound 130, and then removed. As such, the back side 120b of the first semiconductor die 120, the back side 122b of the second semiconductor die 122 and the back side 130b of the molding compound 130 are exposed. In some embodiments, the entire structure may be flipped over and attached to a tape 150 before or after the carrier 110 and the adhesive layer 112 are removed.

In other embodiments, the adhesive layer 112 includes a release layer and a die attach film (not shown) sequentially formed on the carrier 110. In these embodiments, the carrier 110 and the release layer of the adhesive layer 112 may be detached from the first and second semiconductor dies 120 and 122 and the molding compound 130 when exposed to light or heat, and the die attach film may be remained on the back side 120b of the first semiconductor die 120, and the back side 122b of the second semiconductor die 122 and the back side 130b of the molding compound 130. Subsequently, the remained die attach film of the adhesive layer 112 may be removed by, for instance, by a stripping process, an etching process and/or a cleaning process.

Figure 2F:
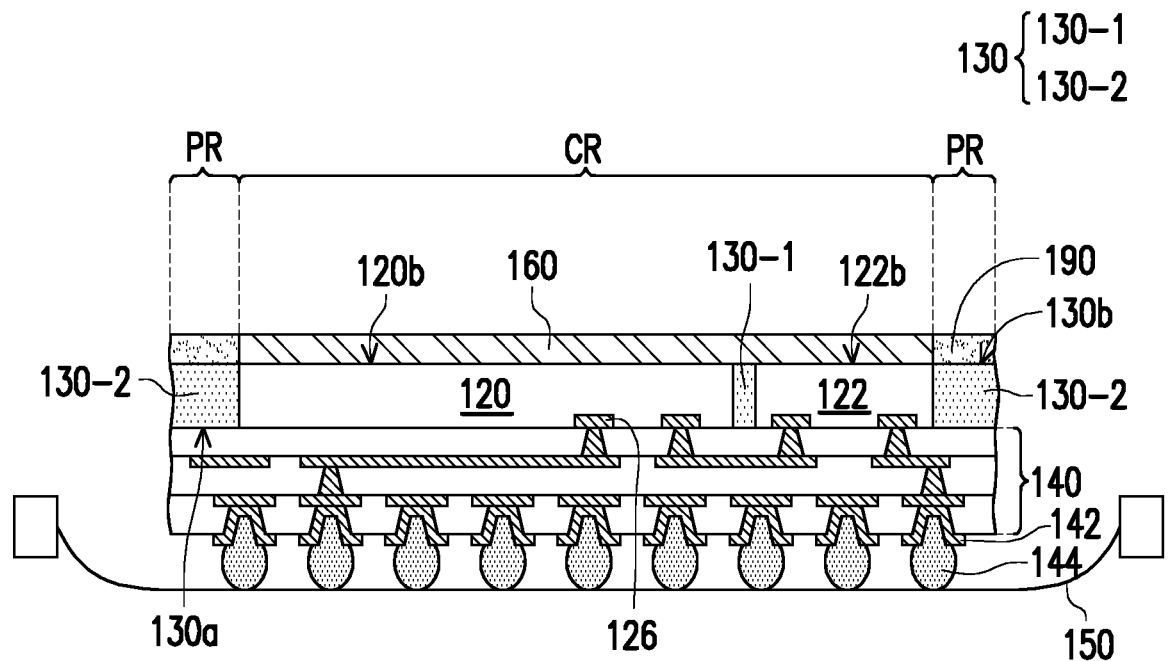
Figure 2G:
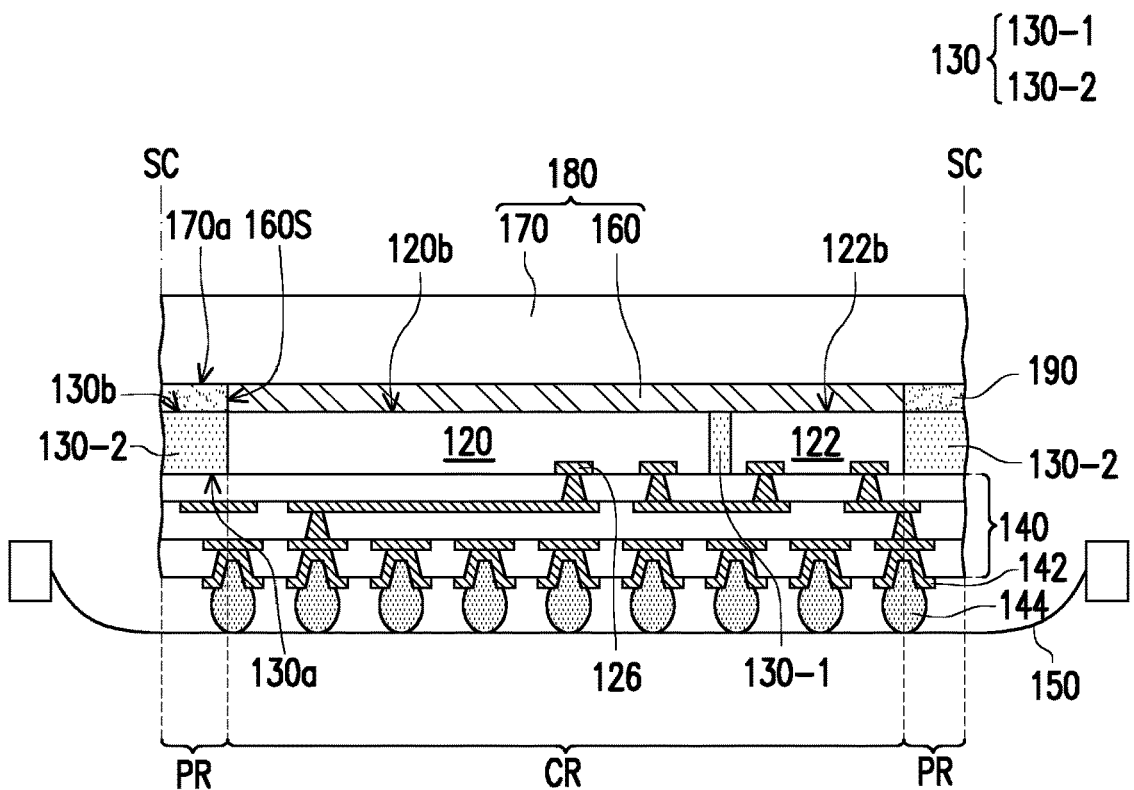

Referring to FIG. 1, FIG. 2F and FIG. 2G, step S110 is performed, and a heat dissipation module 180 is formed on the back side 120b of the first semiconductor die 120, the back side 122b of the second semiconductor die 122 and the molding compound 130. In some embodiments, the formation of the heat dissipation module 180 may include sub-steps of forming a thermal interfacial pattern 160 (as shown in FIG. 2F) and providing a heat spreader 170 (as shown in FIG. 2G) on the thermal interfacial pattern 160.

Referring to FIG. 2F, the thermal interfacial pattern 160 is formed on the back side 120b of the first semiconductor die 120 and the back side 122b of the second semiconductor die 122. In some embodiments, the thermal interfacial pattern 160 is directly contacted with the back side 120b of the first semiconductor die 120 and the back side 122b of the second semiconductor die 122. In some embodiments, the thermal interfacial pattern 160 covers or contacts the central portion 130-1 of the molding compound 130 that is located between the first semiconductor die 120 and the second semiconductor die 122. That is, the thermal interfacial pattern 160 may span across the whole central region CR. In addition, in some embodiments, the thermal interfacial pattern 160 may not cover the peripheral portion 130-2 of the molding compound 130 surrounding the first and second semiconductor dies 120 and 122. In alternative embodiments, the thermal interfacial pattern 160 may partially cover the peripheral portion 130-2 of the molding compound 130. In other words, the thermal interfacial pattern 160 may or may not span into the peripheral region PR. Either way, the thermal interfacial pattern 160 does not completely cover the peripheral region PR. In some embodiments, a formation method of the thermal interfacial pattern 160 may include a dispensing process, a coating process, a printing process, a combination or the like. In addition, a curing process may be performed on a material of the thermal interfacial pattern 160 after it is formed by the above-mentioned method. In some embodiments, a thickness of the thermal interfacial pattern 160 may range from 10 μm to 200 μm. A material of the thermal interfacial pattern 160 may include a composite material containing polymer and metal particles (or metal oxide particles). For instance, a material of the thermal interfacial pattern 160 may include silicone mixed with particles, such as alumina particles, zinc oxide particles or silver particles.

In some embodiments, step S112 of disposing an adhesive material 190 on the back side 130b of the molding compound 130 follows the sub-step of forming the thermal interfacial pattern 160, and precedes the sub-step of providing the heat spreader 170 on the thermal interfacial pattern 160 (as shown in FIG. 2G). In these embodiments, the adhesive material 190 is formed, and the thermal interfacial pattern 160 is surrounded by the adhesive material 190. In other words, the adhesive material 190 is located in the peripheral region PR. In some embodiments, a formation method of the adhesive material 190 may include a dispense process. A material of the adhesive material 190 may include epoxy or silicone based materials. A thickness of the adhesive material 190 may be substantially identical with or greater than the thickness of the thermal interfacial pattern 160, which may range from 10 μm to 200 μm.

Referring to FIG. 2G, the heat spreader 170 is then provided on the thermal interfacial pattern 160. As such, the thermal interfacial pattern 160 is sandwiched between the first and second semiconductor dies 120 and 122 and the heat spreader 170. A material of the heat spreader 170 may include steel, copper, a combination thereof or the like. In some embodiments, a thickness of the heat spreader 170 may range from 300 μm to 3000 μm. In some embodiments, the heat spreader 170 is extended from above the thermal interfacial pattern 160 into the peripheral region PR, and covers the peripheral portion 130-2 of the molding compound 130. In other words, the heat dissipation module 180 including the thermal interfacial pattern 160 and the heat spreader 170 spans from the central region CR into the peripheral region PR. As such, the adhesive material 190 is sandwiched between the heat spreader 170 and the molding compound 130 in the peripheral region PR. In some embodiments, the adhesive material 190 is in contact with the back side 130b of the molding compound 130, a front side 170a of the heat spreader 170 and the sidewall 160S of the thermal interfacial pattern 160. The thickness of the adhesive material 190 may be substantially identical with the thickness of the thermal interfacial pattern 160 once the heat spreader 170 has been disposed and pressed from top of the heat spreader 170. In some embodiments, a curing process may be performed on the adhesive material 190 after the heat spreader 170 has been disposed.

In alternative embodiments, the sub-steps of forming the thermal interfacial pattern 160 and providing the heat spreader 170 may precede the step S112 of disposing the adhesive material 190. In these embodiments, the adhesive material 190 is filled into the space between the heat spreader 170 and the back side 130b of the molding compound 130. Subsequently, a curing process may be performed on the adhesive material 190.

Figure 2H:
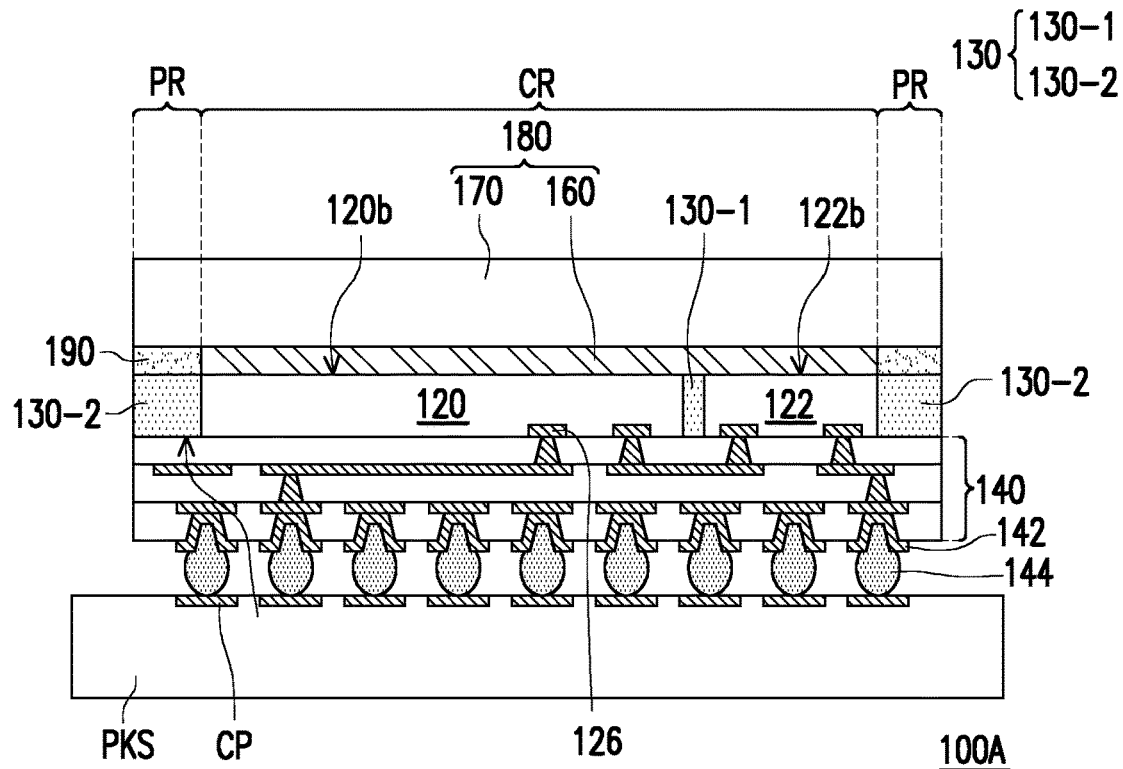

In some embodiments, a singulation process, such as a sawing process or a cutting process, is performed on the current structure. In some embodiments, the current structure is singulated along scribe lines SC. An extension direction of the scribe lines SC is substantially parallel to the sidewalls of the first and second semiconductor dies 120 and 122, and the scribe lines SC may be extended across the peripheral portion 130-2 of the molding compound 130. The tape 150 may be detached from the singulated structure. As shown in FIG. 2H, the singulated structure may contain multiple semiconductor dies (e.g., the first semiconductor die 120 and the second semiconductor die 122), and may be referred as a multi-die package structure. In some embodiments, a sidewall of the heat spreader 170, a sidewall of the adhesive material 160 and a sidewall of the molding compound 130 are substantially coplanar with one another.

In some embodiments, after the singulation process, the redistribution structure 140 and the electrical connectors 144 are further mounted to a package substrate PKS, thus completing the semiconductor package 100A. In some embodiments, the electrical connectors 144 are bonded to conductive pads CP of the package substrate PKG through a solder flux by performing a reflow process. As such, the redistribution structure 140 and the electrical connectors 144 are located in between the first and second semiconductor dies 120 and 122 and the package substrate PKS. In some embodiments, the package substrate PKS may include a printed circuit board (PCB) or an organic package substrate. For example, the organic package substrate may include a flexible organic package substrate, a core organic package substrate or a core-less organic package substrate. In some embodiments, an underfill (not shown) is formed to fill a space between the redistribution structure 140, the electrical connectors 144 and the package substrate PKS. In some embodiments, the underfill surrounds each of the electrical connectors 144. For instance, a material of the underfill may include epoxy resin, silica rubber, a combination thereof or the like.

So far, the semiconductor package 100A according to some embodiments has been fabricated. As compared to a package-on-package (POP) structure, the back sides of the back side 120b of the first semiconductor die 120 and the back side 122b of the second semiconductor die 122 in the semiconductor package 100A according to some embodiments of the present disclosure can be directly contacted with the heat dissipation module 180. As such, a heat path can be directly formed at the back side 120b of the first semiconductor die 120 and the back side 122b of the second semiconductor die 122. Therefore, an efficient heat dissipation can be attained in the semiconductor package 100A. In addition, as compared to the POP structure, multiple semiconductor dies (e.g., the first semiconductor die 120 and the second semiconductor die 122) in the semiconductor package 100A according to some embodiments in the present disclosure can be electrically coupled through the redistribution structure 140. Thus, a data transmission speed among the semiconductor dies can be improved. In some embodiments, the singulation process can be performed after the heat dissipation module 180 is disposed on the back side 120b of the first semiconductor die 120 and the back side 122b of the second semiconductor die 122. As such, a sidewall of the heat dissipation module 180, a sidewall of the adhesive material 190 and a sidewall of the molding compound 130 are substantially coplanar with one another. In addition, a mechanical strength of the to-be-singulated package structure (also known as a reconstructed wafer) can be enhanced. Thus, a warpage of the package structure including the first and second semiconductor dies 120 and 122 and the molding compound 130 can be reduced during the singulation process. Furthermore, in some embodiments, by disposing the adhesive material 190 between the heat dissipation module 180 (e.g., the heat spreader 170 of the heat dissipation module 180) and the molding compound 130 (e.g., the peripheral portion 130-2 of the molding compound 130), an adhesive property between the heat dissipation module 180 and the molding compound 130 can be improved. Therefore, a delamination problem at an interface between the heat dissipation module 180 and the molding compound 130 can be avoided.

Figure 2I:
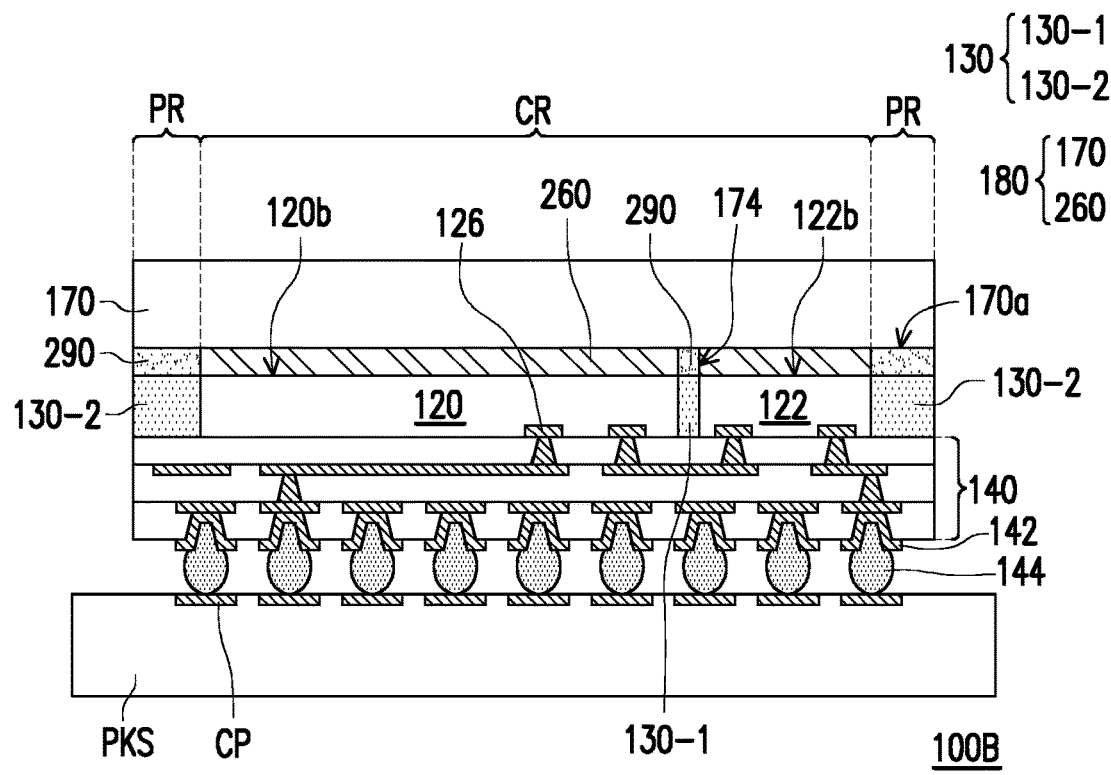
FIG. 2I through FIG. 2K are schematic cross-sectional views illustrating semiconductor packages according to some embodiments of the present disclosure.

FIG. 2I is a schematic cross-sectional view illustrating a semiconductor package 100B according to some embodiments of the present disclosure. The semiconductor package 100B is similar to the semiconductor package 100A as shown in FIG. 2H, difference therebetween will be discussed, and the same part will not be described again.

Referring to FIG. 2I, a thermal interfacial pattern 260 does not cover or does not completely cover the central portion 130-1 of the molding compound 130. In some embodiments, a sidewall of the thermal interfacial pattern 260 is aligned with a sidewall of the central portion 130-1 of the molding compound 130. In alternative embodiments, the thermal interfacial pattern 260 partially covers the central portion 130-1 of the molding compound 130. An adhesive material 290 is further formed on the central portion 130-1 of the molding compound 130. In other words, a space 174 between the front side 170a of the heat spreader 170 and the central portion 130-1 of the molding compound 130 is filled by a portion of the adhesive material 290. In some embodiments, the space 174 is filled up by the adhesive material 290.

Figure 2J:
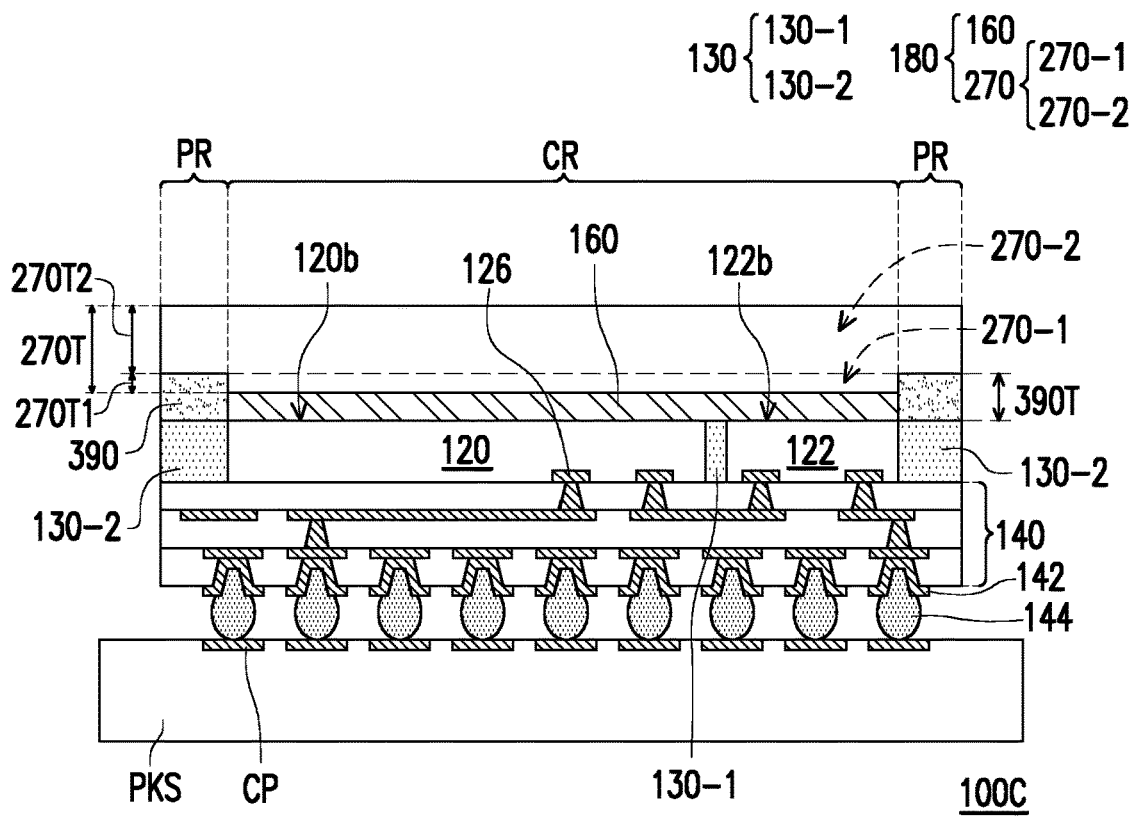

FIG. 2J is a schematic cross-sectional view illustrating a semiconductor package 100C according to some embodiments of the present disclosure. The semiconductor package 100C is similar to the semiconductor package 100A as shown in FIG. 2H, difference therebetween will be discussed, and the same part will not be described again.

Referring to FIG. 2J, a thickness 390T of the adhesive material 390 is greater than the thickness of the thermal interfacial pattern 160. In some embodiments, the thickness 390T of the adhesive material 390 may be greater than 10 μm, and less than or equal to 2800 μm, whereas the thickness of the thermal interfacial pattern 160 may range from 10 μm to 200 μm. In addition, the heat spreader 270 has a bottom portion 270-1 and a top portion 270-2 located on top of the bottom portion 270-1. The bottom portion 270-1 of the heat spreader 270 is located between the thermal interfacial pattern 160 and the top portion 270-2 of the heat spreader 270. The bottom portion 270-1 of the heat spreader 270 is surrounded by the adhesive material 390. The bottom portion 270-1 of the heat spreader 270 spans across the central region CR, and covers the first and second semiconductor dies 120 and 122 and the central portion 130-1 of the molding compound 130. In some embodiments, a sidewall of the bottom portion 270-1 of the heat spreader 270 is substantially aligned with the sidewall of the thermal interfacial pattern 160. The top portion 270-2 of the heat spreader 270 is extended from above the bottom portion 270-1 of the heat spreader 270 into the peripheral region PR, and covers the adhesive material 390 and the peripheral portion 130-2 of the molding compound 130. In some embodiments, a ratio of the thickness 270T1 of the bottom portion 270-1 of the heat spreader 270 with respect to a total thickness 270T of the heat spreader 270 may range from 0.01 to 0.8. In some embodiments, a sum of the thickness 270T1 of the bottom portion 270-1 of the heat spreader 270 and the thickness of the thermal interfacial pattern 160 is substantially equal to the thickness 390T of the adhesive material 390. The total thickness 270T of the heat spreader 270 is a sum of the thickness 270T1 of the bottom portion 270-1 and a thickness 270T2 of the top portion 270-2 of the heat spreader 270. For instance, the total thickness 270T of the heat spreader 270 may range from 300 μm to 3000 μm. In these embodiments, the thickness 270T1 of the bottom portion 270-1 of the heat spreader 270 may range from 3 μm to 2400 μm. In addition, the 270T2 of the top portion 270-2 of the heat spreader 270 may range from 297 μm to 600 μm.

In these embodiments, a space between the top portion 270-2 of the heat spreader 270 and the molding compound 130 is filled by the adhesive material 390. As such, the adhesive material 390 is in contact with a bottom surface of the top portion 270-2, and further in contact with a sidewall of the bottom portion 270-1. Accordingly, an area of the interface between the heat dissipation module 180 (e.g., the heat spreader 270 of the heat dissipation module 180) and the adhesive material 390 is increased. Thus, an adhesive property between the heat dissipation module 180 (e.g., the heat spreader 270 of the heat dissipation module 180) and the molding compound 130 can be further improved.

Figure 2K:
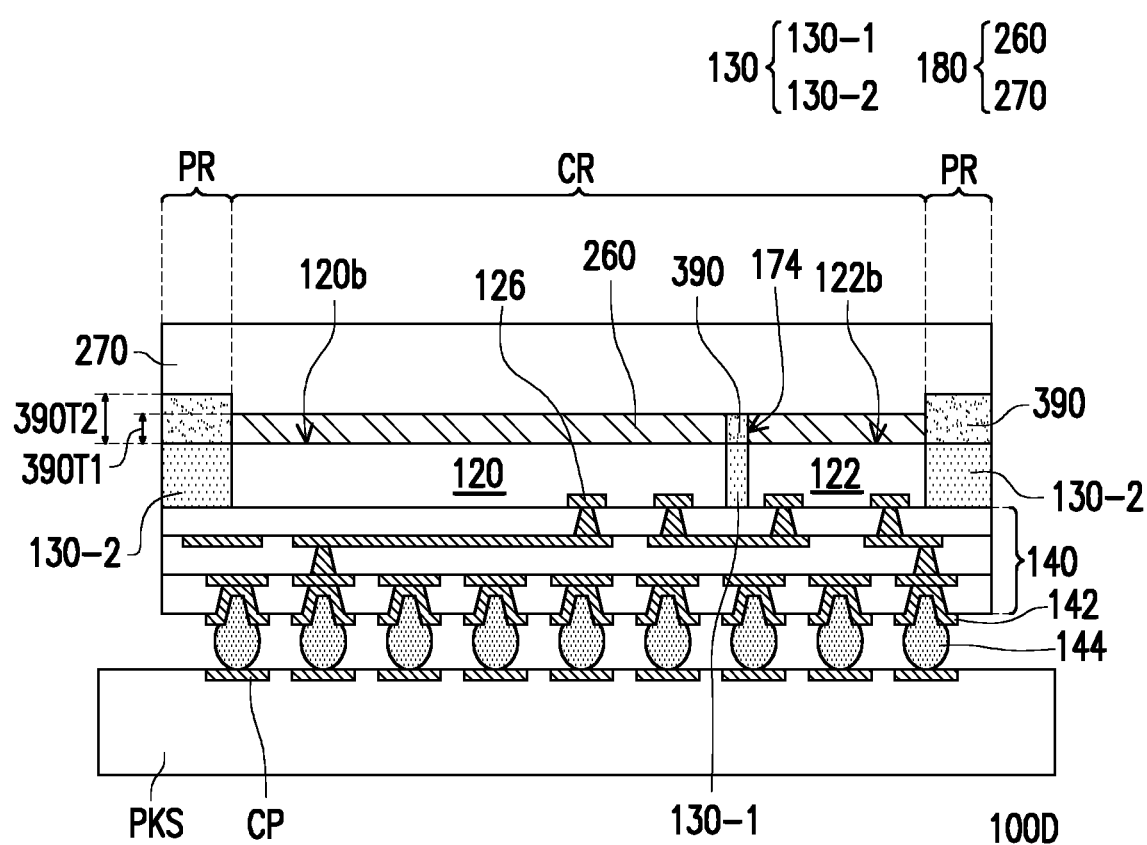

FIG. 2K is a schematic cross-sectional view illustrating a semiconductor package 100D according to some embodiments of the present disclosure. The semiconductor package 100D is similar to the semiconductor package 100C as shown in FIG. 2J, difference therebetween will be discussed, and the same part will not be described again.

Referring to FIG. 2K, the thermal interfacial pattern 260 does not completely cover the central portion 130-1 of the molding compound 130. In some embodiments, a sidewall of the thermal interfacial pattern 260 is aligned with a sidewall of the central portion 130-1 of the molding compound 130. In alternative embodiments, the thermal interfacial pattern 260 partially covers the central portion 130-1 of the molding compound 130. The adhesive material 390 is further formed on the central portion 130-1 of the molding compound 130. In other words, a space 174 between the front side 270a of the heat spreader 270 (i.e., the front side 270a of the bottom portion 270-1 of the heat spreader 270) and the central portion 130-1 of the molding compound 130 is filled by the adhesive material 390. In some embodiments, the space 174 is filled up by the adhesive material 390. In some embodiments, a portion of the adhesive material 390 located between the central portion 130-1 of the molding compound 130 and the bottom portion 270-1 of the heat spreader 270 has a thickness 390T1, which may be identical with a thickness of the thermal interfacial pattern 160. Another portion of the adhesive material 390 located between the peripheral portion 130-2 of the molding compound 130 and the top portion 270-2 of the heat spreader 270 has a thickness 390-2. In some embodiments, the thickness 390-2 is greater than the thickness 390-1. For instance, the thickness 390-2 may range from 10 µm to 2800 µm. The thickness 390-1 may range from 7 µm to 200 µm.

Figure 3A:
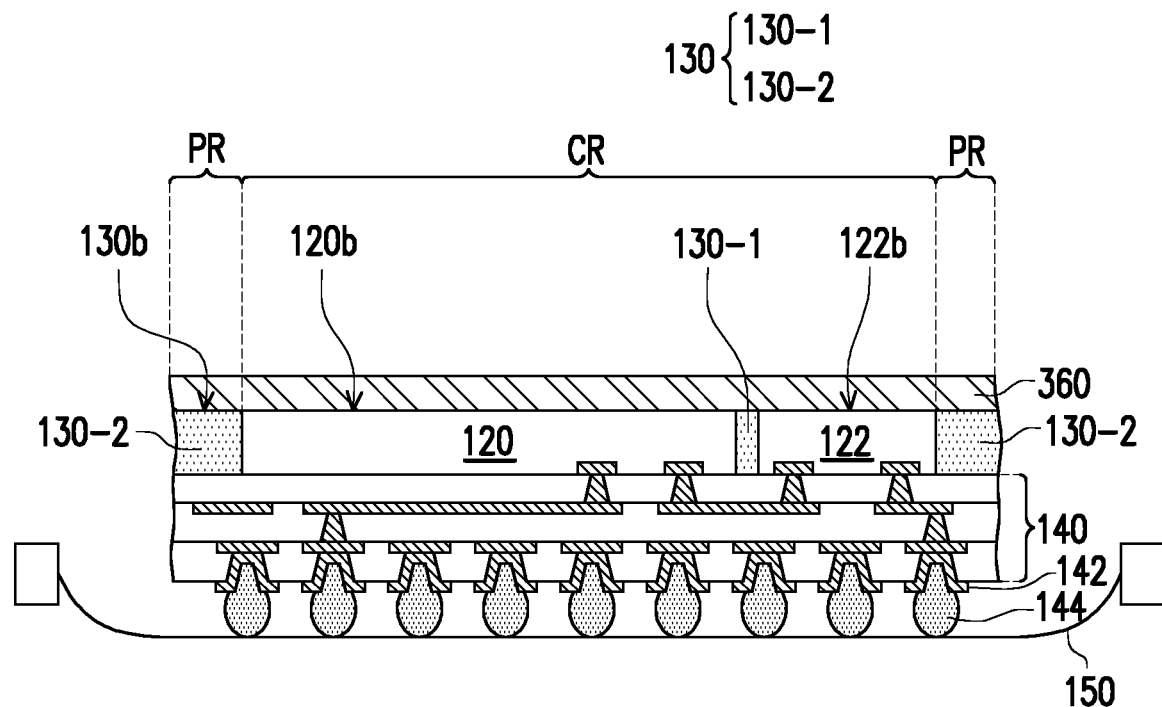
FIG. 3A through FIG. 3C are schematic cross-sectional views illustrating intermediate structures at various stages during the manufacturing method of semiconductor package according to some embodiments.
Figure 3B:
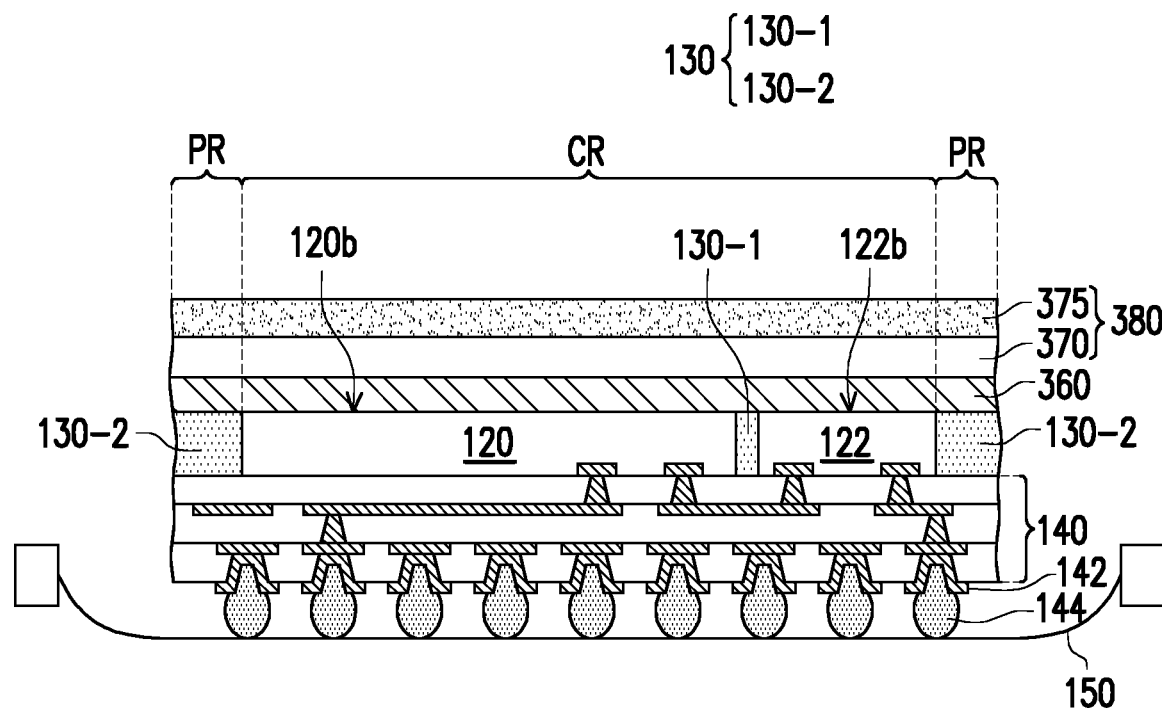
Figure 3C:
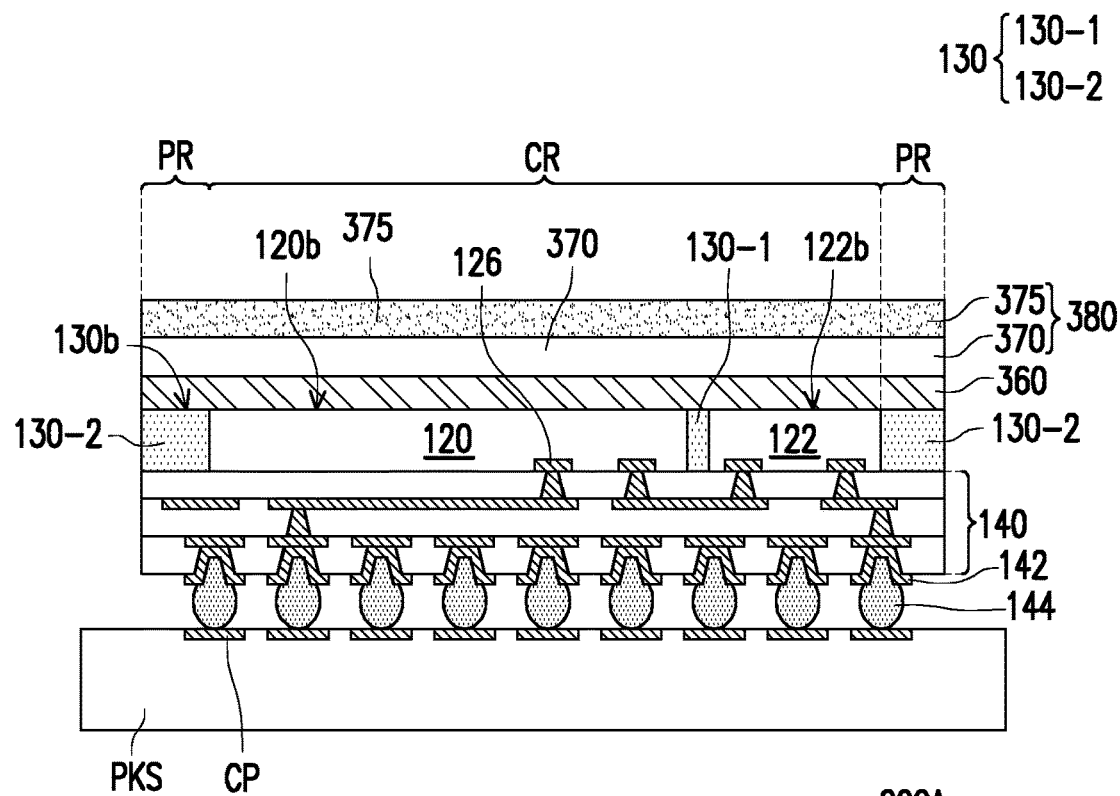

FIG. 3A through FIG. 3C are schematic cross-sectional views illustrating intermediate structures at various stages during the manufacturing method of a semiconductor package 200A according to some embodiments. The manufacturing method of the semiconductor package 200A is similar to the manufacturing method of the semiconductor package 100A as shown in FIG. 2A through FIG. 2H, difference therebetween will be discussed, and the same part will not be described again.

Referring to FIG. 1 and FIG. 3A, the step S100 through the step S108 are performed. In some embodiments, the step S112 precedes the step S110. In step S112, an adhesive material 360 is formed on the back side 130b of the molding compound 130. In some embodiments, the adhesive material 360 is a blanket layer that covers the back side 120b of the first semiconductor die 120, the back side 122b of the second semiconductor die 122 and the back side 130b of the molding compound 130. In other words, the adhesive material 360 spans across the central region CR and the peripheral region PR. In some embodiments, the adhesive material 360 is in direct contact with the back sides of the semiconductor dies and the back side 130b of the molding compound 130. In some embodiments, a material of the adhesive material 360 may include titanium, tantalum, chromium, a combination thereof or the like. A formation method of the adhesive material 360 may include physical vapor deposition (PVD), such as sputtering. A thickness of the adhesive material 360 may range from 100 nm to 2000 nm.

Referring to FIG. 1 and FIG. 3B, the step S110 is performed, and a heat dissipation module 380 is formed on the back side 120b of the first semiconductor die 120, the back side 122b of the second semiconductor die 122 and the molding compound 130. In some embodiments, the heat dissipation module 380 includes a plurality of heat dissipation layers, such as a first heat dissipation layer 370 and a second heat dissipation layer 375. The first heat dissipation layer 370 and the second heat dissipation layer 375 are sequentially formed on the adhesive material 360. As such, the first heat dissipation layer 370 is stacked between the adhesive material 360 and the second heat dissipation layer 375. In some embodiments, the first heat dissipation layer 370 and the second heat dissipation layer 375 are blanket layers that cover the molding compound 130 and the first and second semiconductor dies 120 and 122. In other words, in some embodiments, the first and second heat dissipation layers 370 and 375 span across the central region CR and the peripheral region PR.

In some embodiments, materials of the first heat dissipation layer 370 and the second heat dissipation layer 375 may include metal or metal alloy. For instance, a material of the first heat dissipation layer 370 may include copper, and a material of the second heat dissipation layer 375 may include nickel. As such, the second heat dissipation layer 375 can protect the first heat dissipation layer 370 from being oxidized in ambient atmosphere. A formation method of the first heat dissipation layer 370 and the second heat dissipation layer 375 may include plating process, such as electroplating, electroless plating or chemical plating. A seed layer may be formed, by sputtering, on the adhesive material 360 before forming the first heat dissipation layer 370 and the second heat dissipation layer 375. A thickness of the first heat dissipation layer 370 may range from 1 µm to 100 µm. A thickness of the second heat dissipation layer 375 may range from 0.1 µm to 30 µm. Since the heat dissipation module 380 is relatively thin, it is advantageous for the heat dissipation module 380 to remove heat from the first and second semiconductor dies.

In alternative embodiments, the heat dissipation module 380 further includes a third heat dissipation layer (not shown). The third dissipation layer is disposed between the adhesive material 360 and the first heat dissipation layer 370. A material of the third heat dissipation layer may include nickel. A thickness of the third heat dissipation layer may range from 0.1 µm to 30 µm.

In some embodiments, a singulation process is performed on the current structure. The tape 150 may be detached from the singulated structure. As shown in FIG. 3C, the singulated structure may contain multiple semiconductor dies (e.g., the first semiconductor die 120 and the second semiconductor die 122), and may be referred as a multi-die package structure. In some embodiments, a sidewall of the heat dissipation module 380, a sidewall of the adhesive material 360 and a sidewall of the molding compound 130 are substantially coplanar with one another after the singulation process. In some embodiments, after the singulation process, the redistribution structure 140 and the electrical connectors 144 are further mounted to a package substrate PKS, thus completing the semiconductor package 200A.

Figure 3D:
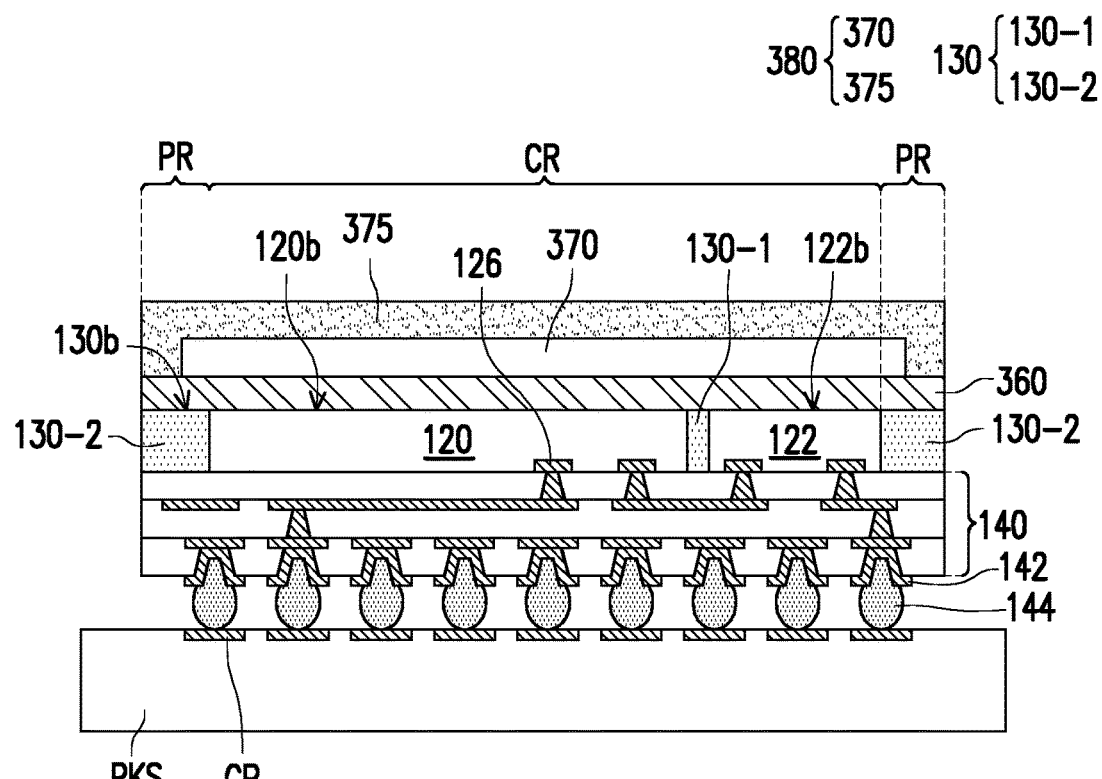
FIG. 3D is a schematic cross-sectional view illustrating a semiconductor package according to some embodiments of the present disclosure.

FIG. 3D is a schematic cross-sectional view illustrating a semiconductor package 200B according to some embodiments of the present disclosure. The semiconductor package 200B is similar to the semiconductor package 200A as shown in FIG. 3C, difference therebetween will be discussed, and the same part will not be described again.

Referring to FIG. 3D, in some embodiments, the first heat dissipation layer 370 may not be a blanket layer. Instead, the first heat dissipation layer 370 covers the first and second semiconductor dies 120 and 122 and the central portion 130-1 of the molding compound 130, without completely covering the peripheral portion 130-2 of the molding compound 130. In these embodiments, the seed layer (not shown) formed between the first heat dissipation layer 370 and the adhesive material 360 may be patterned, to at least partially expose the peripheral portion 130-2 of the molding compound 130. That is, the first heat dissipation layer 370 does not span across the whole area of the peripheral region PR. Correspondingly, the second heat dissipation layer 375 is formed over the first heat dissipation layer 370, and may cover a top surface and a sidewall of the first heat dissipation layer 370.

Figure 4A:
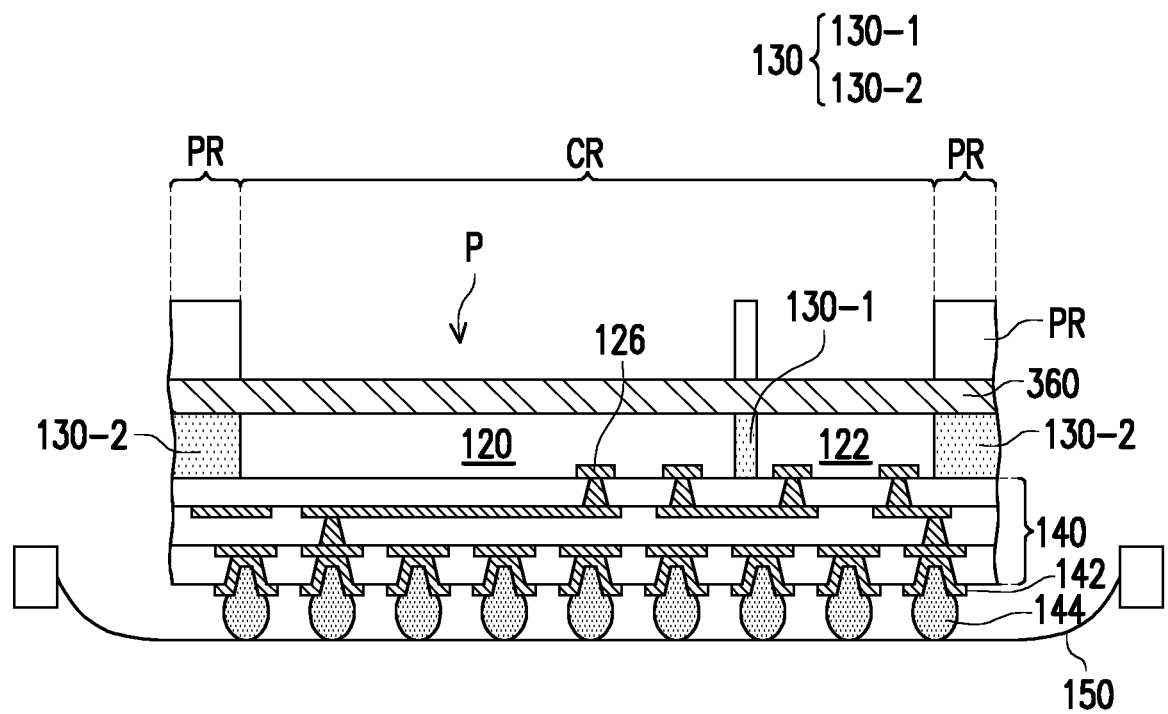
FIG. 4A through FIG. 4C are schematic cross-sectional views illustrating intermediate structures at various stages during the manufacturing method of semiconductor package according to some embodiments.
Figure 4B:
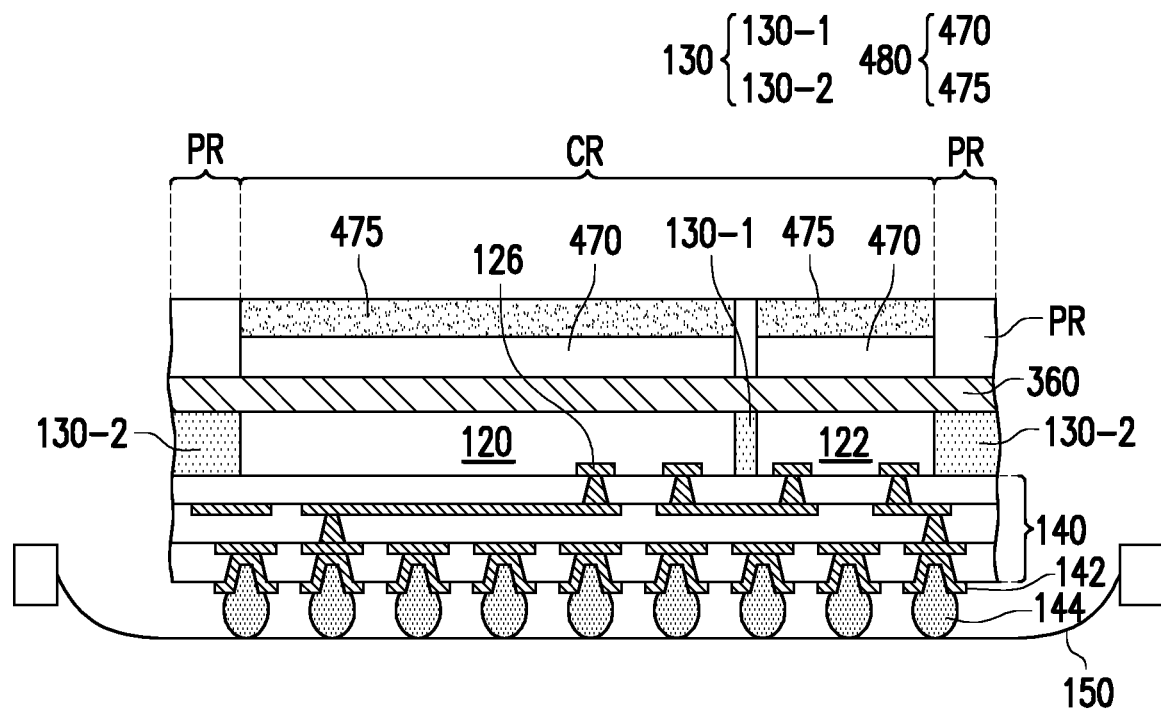
Figure 4C:
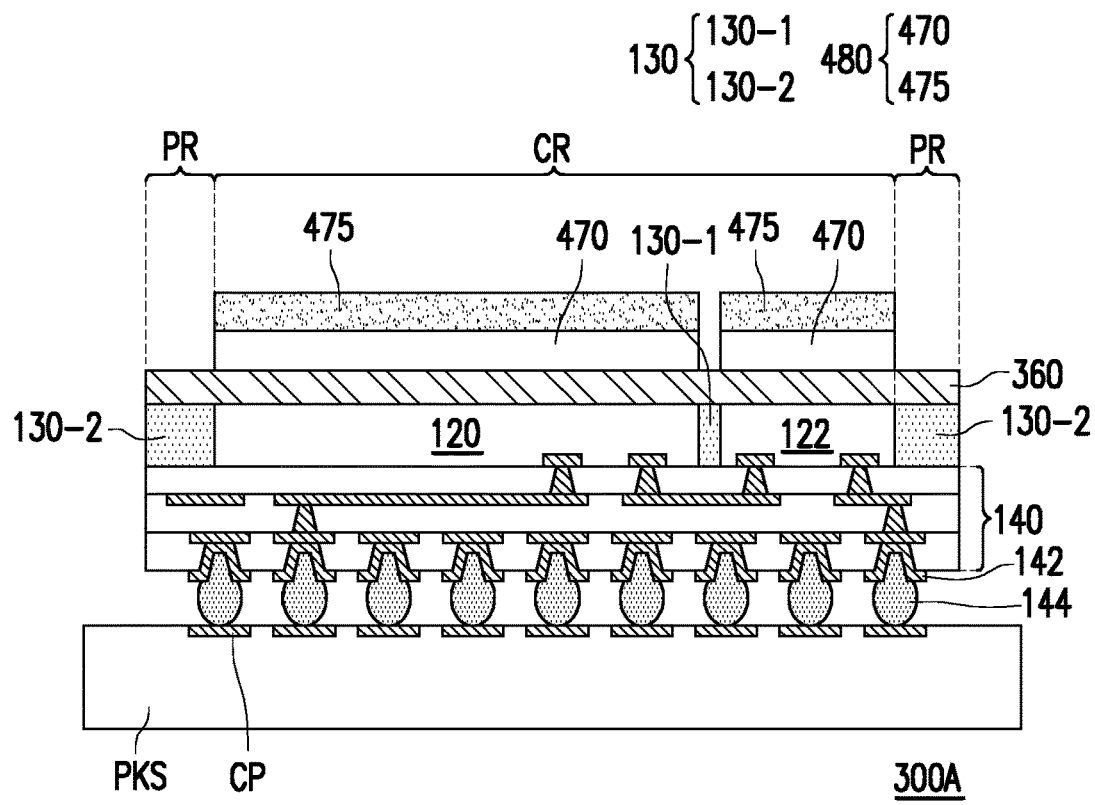

FIG. 4A through FIG. 4C are schematic cross-sectional views illustrating intermediate structures at various stages during the manufacturing method of a semiconductor package 300A according to some embodiments. The manufacturing method of the semiconductor package 300A is similar to the manufacturing method of the semiconductor package 200A as shown in FIG. 3A through FIG. 3C, difference therebetween will be discussed, and the same part will not be described again.

Referring FIG. 1 and FIG. 4A, the step S100 through the step S108 and the step S112 are performed. Subsequently, a mask pattern PR is formed on the adhesive material 360. The mask pattern PR covers the central portion 130-1 and the peripheral portion 130-2 of the molding compound 130, and has an opening P over the first and second semiconductor dies 120 and 122. In other words, a bottom surface of the opening P is vertically overlapped with the first and second semiconductor dies 120 and 122. In some embodiments, a material of the mask pattern PR may include photoresist, silicon oxide, silicon nitride or the like.

Referring to FIG. 1 and FIG. 4B, the step S110 is performed, a heat dissipation module 480 is formed on the back side 120b of the first semiconductor die 120 and the back side 122b of the second semiconductor die 122. The heat dissipation module 480 is formed in the opening P of the mask pattern PR. In some embodiments, the heat dissipation module 480 includes a first heat dissipation layer 470 and a second heat dissipation layer 475 sequentially formed in the opening P. As such, the first heat dissipation layer 470 and the second heat dissipation layer 475 cover the back side 120b of the first semiconductor die 120 and the back side 122b of the second semiconductor die 122 without covering the molding compound 130. In other words, the first and second heat dissipation layers 470 and 475 may not vertically overlapped with the central and peripheral portions 130-1 and 130-2 of the molding compound 130. In some embodiments, a sidewall of the heat dissipation module 480 is aligned with sidewalls of the first and second semiconductor dies 120 and 122.

Referring to FIG. 1 and FIG. 4C, the mask pattern PR is removed. Accordingly, the heat dissipation module 480 exposes a portion of the adhesive material 360. A singulation process is performed on the current structure. In some embodiments, a sidewall of the adhesive material 360 and a sidewall of the molding compound 130 are substantially coplanar. The tape 150 may be detached from the singulated structure. In some embodiments, after the singulation process, the redistribution structure 140 and the electrical connectors 144 are further mounted to a package substrate PKS, thus completing the semiconductor package 300A.

Figure 4D:
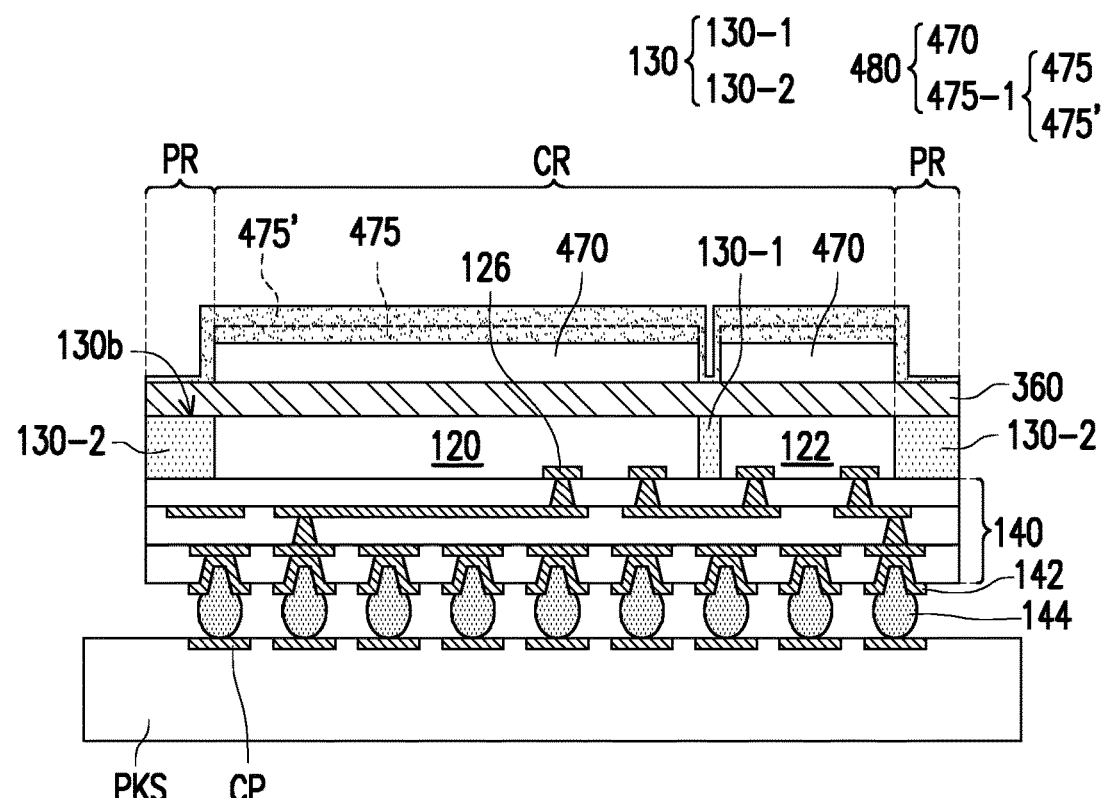
FIG. 4D is a schematic cross-sectional view illustrating a semiconductor package according to some embodiments of the present disclosure.

FIG. 4D is a schematic cross-sectional view illustrating a semiconductor package 300B according to some embodiments of the present disclosure. The semiconductor package 300B is similar to the semiconductor package 300A as shown in FIG. 4C, difference therebetween will be discussed, and the same part will not be described again.

Referring to FIG. 4D, the second heat dissipation layer 475-1 of the heat dissipation module 480 further covers a sidewall of the first heat dissipation layer 470 and a back side 130b of the molding compound 130. In some embodiments, the second heat dissipation layer 475-1 may be conformally disposed on the adhesive material 360 and the first heat dissipation layer 470. In some embodiments, after the steps of forming the second heat dissipation layer 475 and removing the mask pattern PR (as shown in FIG. 4A), the step of forming the second heat dissipation layer 475 is repeated again, so as to form the second heat dissipation layer 475' on the underlying second heat dissipation layer 475. That is, the second heat dissipation layer 475-1 includes the second heat dissipation layer 475 and the second heat dissipation layer 475'. The second heat dissipation layer 475' covers a top surface and a sidewall of the underlying second heat dissipation layer 475, and further covers a top surface of the adhesive material 360.

In alternative embodiments, the step of removing the mask pattern PR (shown in FIG. 4B) precedes the step of forming the second heat dissipation layer 475-1. In addition, the second heat dissipation layer 475-1 may be formed by applying one or more plating processes.

As compared to a package-on-package (POP) structure, the back sides of the semiconductor dies in the semiconductor package according to some embodiments of the present disclosure can be directly contacted with the heat dissipation module. As such, a heat path can be directly formed at the back sides of the semiconductor dies. Therefore, an efficient heat dissipation can be attained in the semiconductor package. In addition, as compared to the POP structure, multiple semiconductor dies in the semiconductor package according to some embodiments in the present disclosure can be electrically coupled through the redistribution structure. Thus, a data transmission speed among the semiconductor dies can be improved. In some embodiments, the singulation process can be performed after the heat dissipation module is disposed on the back sides of the semiconductor dies. As such, a mechanical strength of the to-be-singulated package structure (also known as a reconstructed wafer) can be enhanced. Thus, a warpage of the package structure including the semiconductor dies and the molding compound can be reduced during the singulation process. Furthermore, in some embodiments, by disposing the adhesive material between the heat dissipation module and the molding compound, an adhesive property between the heat dissipation module and the molding compound can be improved. Therefore, a delamination problem at an interface between the heat dissipation module and the molding compound can be avoided.

In some embodiments of the present disclosure, a semiconductor package is provided. The semiconductor package includes a first semiconductor die, a second semiconductor die, a molding compound, a heat dissipation module and an adhesive material. The first and second semiconductor dies are different types of dies and are disposed side by side. The molding compound encloses the first and second semiconductor dies. The heat dissipation module is located directly on and in contact with the back sides of the first and second semiconductor dies. The adhesive material is filled and contacted between the heat dissipation module and the molding compound. The semiconductor package has a central region and a peripheral region surrounding the central region. The first and second semiconductor dies are located within the central region. A sidewall of the heat dissipation module, a sidewall of the adhesive material and a sidewall of the molding compound are substantially coplanar with one another.

In some embodiments of the present disclosure, a semiconductor package is provided. The semiconductor package includes a first semiconductor die, a second semiconductor die, a molding compound, an adhesive material and a heat dissipation module. The first and second semiconductor dies are different types of dies and are disposed side by side. The molding compound encloses the first and second semiconductor dies. The adhesive material is disposed over and in direct contact with the back sides of the first and second semiconductor dies and the molding compound. The heat dissipation module comprises a plurality of heat dissipation layers stacked on the adhesive material. The semiconductor package has a central region and a peripheral region. The central region is surrounded by the peripheral region. The first and second semiconductor dies and a central portion of the molding compound located between the first and second semiconductor dies are within the central region. A peripheral portion of the molding compound surrounding the first and second semiconductor dies is located within the peripheral region. The adhesive material spans across the central region and the peripheral region.

In some embodiments of the present disclosure, a manufacturing method of semiconductor package is provided. The manufacturing method of semiconductor package includes: placing a first semiconductor die and a second semiconductor die on a carrier, wherein the first and second semiconductor dies are different types of dies and are disposed side by side; forming a molding compound on the carrier enclosing sidewalls of the first and second semiconductor dies and exposing front sides of the first and second semiconductor dies; forming a redistribution structure on the front sides of the first and second semiconductor dies and on the molding compound; removing the carrier, to expose a back side of the molding compound and back sides of the first and second semiconductor dies; disposing a heat dissipation module on the back sides of the first and second semiconductor dies and the molding compound. The adhesive material is located between the molding compound and the heat dissipation module.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
    a first semiconductor die and a second semiconductor die, wherein the first and second semiconductor dies are different types of dies and are disposed side by side;
    a molding compound, enclosing the first and second semiconductor dies;
    a heat dissipation module, located directly on and in contact with back sides of the first and second semiconductor dies; and
    an adhesive material, filled between and contacting the heat dissipation module and the molding compound,
    wherein the semiconductor package has a central region and a peripheral region surrounding the central region, the first and second semiconductor dies are located within the central region,
    wherein a sidewall of the heat dissipation module, a sidewall of the adhesive material and a sidewall of the molding compound are coplanar with one another,
    wherein the heat dissipation module comprises a thermal interfacial pattern in contact with the back sides of the first and second semiconductor dies,
    wherein the thermal interfacial pattern and the adhesive material are made of different materials, and
    wherein a portion of the adhesive material that is located within the central region is sandwiched between the heat dissipation module and a central portion of the molding compound that is located between the first and second semiconductor dies.

2. The semiconductor package of claim 1, wherein the heat dissipation module further comprises a heat spreader located on the thermal interfacial pattern, the thermal interfacial pattern is in direct contact with the back sides of the first and second semiconductor dies, and the thermal interfacial pattern located within the central region is sandwiched between the first and second semiconductor dies and the heat spreader.

3. The semiconductor package of claim 2, wherein the heat spreader has a bottom portion and a top portion located on top of the bottom portion, and the bottom portion of the heat spreader is surrounded by the adhesive material that is located in the peripheral region.

4. The semiconductor package of claim 2, wherein the heat spreader has a bottom portion and a top portion located on top of the bottom portion, the bottom portion of the heat spreader covers the portion of the adhesive material that is located in the central region and the bottom portion of the heat spreader is surrounded by another portion of the adhesive material that is located in the peripheral region, and the portion of the adhesive material located in the central region has a thickness less than a thickness of the another portion of the adhesive material located in the peripheral region.

5. The semiconductor package of claim 1, wherein a topmost surface of the adhesive material is higher than or coplanar with the back sides of the first and second semiconductor dies.

6. The semiconductor package of claim 1, wherein the portion of the adhesive material that is located within the central region is located between adjacent sub-patterns of the thermal interfacial pattern.

7. The semiconductor package of claim 1, wherein the portion of the adhesive material that is located within the central region has a thickness equal to a thickness of another portion of the adhesive material that is located in the peripheral region.

8. The semiconductor package of claim 1, further comprising:
    a redistribution structure, disposed at front sides of the first and second semiconductor dies, and electrically connected with the first and second semiconductor dies; and
    a plurality of electrical connectors, disposed on the redistribution structure and electrically connected with the redistribution structure.

9. A manufacturing method of semiconductor package, comprising:
    placing a first semiconductor die and a second semiconductor die on a carrier, wherein the first and second semiconductor dies are different types of dies and are disposed side by side;
    forming a molding compound on the carrier enclosing sidewalls of the first and second semiconductor dies and exposing front sides of the first and second semiconductor dies;
    forming a redistribution structure on the front sides of the first and second semiconductor dies and on the molding compound;
    removing the carrier, to expose a back side of the molding compound and back sides of the first and second semiconductor dies;
    disposing an adhesive material on the back side of the molding compound; and
    disposing a heat dissipation module on the back sides of the first and second semiconductor dies and the molding compound, wherein the adhesive material is filled between and contacts the molding compound and the heat dissipation module, wherein disposing the heat dissipation module comprises forming a thermal interfacial pattern on the back sides of the first and second semiconductor dies, and the thermal interfacial pattern is formed of a material different from that of the adhesive material, and wherein a portion of the adhesive material is sandwiched between the heat dissipation module and a central portion of the molding compound that is located between the first and second semiconductor dies.

10. The manufacturing method of semiconductor package of claim 9, wherein the thermal interfacial pattern is in direct contact with the back sides of the first and second semiconductor dies, and wherein disposing the heat dissipation module further comprises providing a heat spreader on the thermal interfacial pattern.

11. The manufacturing method of semiconductor package of claim 10, wherein the step of disposing the adhesive material follows the sub-step of forming the thermal interfacial pattern and precedes the sub-step of providing the heat spreader on the thermal interfacial pattern.

12. The manufacturing method of semiconductor package of claim 10, wherein the step of disposing the adhesive material follows the step of disposing the heat dissipation module.

13. The manufacturing method of semiconductor package of claim 12, further comprising: performing a singulation process on the heat dissipation module, the adhesive material and the molding compound after the steps of disposing the adhesive material and disposing the heat dissipation module.

14. A semiconductor package, comprising:
a plurality of semiconductor dies, disposed side by side in a central region of the semiconductor package;
a molding compound, laterally encapsulating the plurality of semiconductor dies;
a thermal interfacial pattern, disposed over the molding compound and on back sides of the plurality of semiconductor dies and located in the central region;
an adhesive material, disposed over the molding compound, wherein the thermal interfacial pattern is laterally surrounded by the adhesive material, and the thermal interfacial pattern and the adhesive material are made of different materials; and
a heat spreader, disposed over the thermal interfacial pattern and the adhesive material,
wherein the thermal interfacial pattern comprises a plurality of sub-patterns laterally separated from one another by a central portion of the adhesive material, and the central portion of the adhesive material is located directly on the molding compound.

15. The semiconductor package of claim 14, wherein the plurality of sub-patterns of the thermal interfacial pattern respectively cover the back side of one of the plurality of semiconductor dies.

16. The semiconductor package of claim 14, wherein a first thickness of a portion of the heat spreader located in the central region is equal to a second thickness of another portion of the heat spreader located in a peripheral region of the semiconductor package.

17. The semiconductor package of claim 14, wherein a first thickness of a portion of the heat spreader located in the central region is greater than a second thickness of another portion of the heat spreader located in a peripheral region of the semiconductor package.

18. The semiconductor package of claim 14, wherein the adhesive material has a peripheral portion laterally surrounding the plurality of sub-patterns of the thermal interfacial pattern and the central portion of the adhesive material.

19. The semiconductor package of claim 18, wherein a sidewall of the peripheral portion of the adhesive material is coplanar with a sidewall of the heat spreader and a sidewall of the molding compound.

20. The semiconductor package of claim 18, wherein a thickness of the central portion of the adhesive material is less than or equal to the peripheral portion of the adhesive material.

* * * * *